(12) United States Patent
Gerard et al.

(10) Patent No.: US 9,219,180 B2
(45) Date of Patent: Dec. 22, 2015

(54) OPTOELECTRONIC ARRANGEMENT PROVIDED WITH A SEMICONDUCTOR NANOWIRE WITH A LONGITUDINAL SECTION THAT IS SURROUNDED BY A PART OF A MIRROR

(71) Applicants: Commissariat a l'energie Atomique et aux Energies Alternatives, Paris (FR); CNRS, Paris (FR)

(72) Inventors: Jean-Michel Gerard, Saint Martin d'Uriage (FR); Julien Claudon, Saint Martin le Vinoux (FR); Philippe Lalanne, Palaiseau (FR)

(73) Assignees: COMMISSARIAT A L'ENERGIE ATOMIQUE ET AUX ENERGIES ALTERNATIVE, Paris (FR); CNRS, Paris (FR)

( * ) Notice: Subject to any disclaimer, the term of this patent is extended or adjusted under 35 U.S.C. 154(b) by 0 days.

(21) Appl. No.: 14/268,624

(22) Filed: May 2, 2014

(65) Prior Publication Data
US 2014/0326945 A1    Nov. 6, 2014

(30) Foreign Application Priority Data

May 2, 2013   (FR) ..................... 13 54060

(51) Int. Cl.
| | | |
|---|---|---|
| *H01L 31/0352* | (2006.01) | |
| *H01L 33/06* | (2010.01) | |
| *H01L 33/10* | (2010.01) | |
| *H01L 33/60* | (2010.01) | |
| *H01L 33/18* | (2010.01) | |
| *H01L 33/24* | (2010.01) | |
| *H01L 33/46* | (2010.01) | |
| *H01L 31/18* | (2006.01) | |
| *H01L 33/00* | (2010.01) | |
| *H01L 31/056* | (2014.01) | |
| *H01L 33/08* | (2010.01) | |

(52) U.S. Cl.
CPC ...... *H01L 31/035227* (2013.01); *H01L 31/056* (2014.12); *H01L 31/18* (2013.01); *H01L 33/005* (2013.01); *H01L 33/06* (2013.01); *H01L 33/18* (2013.01); *H01L 33/24* (2013.01); *H01L 33/46* (2013.01); *H01L 33/08* (2013.01); *H01L 33/10* (2013.01)

(58) Field of Classification Search
None
See application file for complete search history.

(56) References Cited

U.S. PATENT DOCUMENTS

| | | | |
|---|---|---|---|
| 2008/0149944 A1 | 6/2008 | Samuelson et al. | |
| 2010/0276664 A1 | 11/2010 | Hersee | |
| 2014/0301420 A1* | 10/2014 | Kawaguchi et al. | 372/45.012 |

OTHER PUBLICATIONS

Niels Gregersen et al., Designs for High-Efficiency Electrically Pumped Photonic Nanowire Single-Photon Sources, Optics Express, Sep. 27, 2010, vol. 18, No. 20, Department of Photonics Engineering, Technical University of Denmark.

(Continued)

*Primary Examiner* — Joseph Schoenholtz
(74) *Attorney, Agent, or Firm* — Frommer Lawrence & Haug LLP

(57) ABSTRACT

The optoelectronic arrangement comprises a semiconductor nanowire intended to participate in the processing, notably in a reception and/or an emission, of a light concerned and a mirror reflecting the light concerned. The semiconductor nanowire comprises a first section and a second section, and the mirror surrounds, at least longitudinally, the first section of the semiconductor nanowire, said second section extending out of the mirror.

20 Claims, 5 Drawing Sheets

(56) References Cited

OTHER PUBLICATIONS

I. Friedler et al., Efficient Photonic Mirrors for Semiconductor Nanowires, Nov. 15, 2008, 2635-2637, vol. 33, No. 22, Optics Letters.

French Search Report dated Jan. 23, 2014.

* cited by examiner

OPTOELECTRONIC ARRANGEMENT PROVIDED WITH A SEMICONDUCTOR NANOWIRE WITH A LONGITUDINAL SECTION THAT IS SURROUNDED BY A PART OF A MIRROR

TECHNICAL FIELD OF THE INVENTION

The invention relates to the field of optoelectronics.
The subject of the invention is more particularly an optoelectronic arrangement comprising a semiconductor nanowire.

STATE OF THE ART

Semiconductor-based nanowires are recognized as being good candidates when it comes to producing optoelectronic devices.

This is because the thread-like geometry of a nanowire makes it possible to construct a wide variety of nano-heterostructures, and to act, widely, on their electronic and optical properties.

It will be noted that there are two main approaches for the fabrication of nanowires, the approach based on epitaxial growth (referred to as "bottom-up" growth) and the nanofabrication-based approach (known as "top-down" fabrication) based among other things on lithography and etching.

For mass applications, for which reducing the fabrication cost is a major issue, the epitaxial growth approach is much more attractive.

Among the numerous potential applications of nanowires in optoelectronics and photonics, there are mainly:
  light-emitting diodes,
  photovoltaic cells,
  single photon sources.

For these applications, the integration of a mirror at the level of the base of the nanowires is particularly desirable to maximize the effectiveness of extraction (in the light-emitting diodes and the single photon sources), or reinforce the absorption in the photovoltaic cells.

In this regard, it is known practice to use a planar mirror which ensures a good reflectivity. As an example, a horizontal film of gold, placed under a set of vertical nanowires of small diameter d, makes it possible to reflect more than 90% of the light at normal incidence. A diameter is considered to be "small" if it is significantly less than the length of the radiation wave concerned, for example $d<0.3\lambda/n$, where n designates the refractive index of the material forming the nanowire.

Another particular case is that of the larger diameter nanowires, optimized for effective light guidance. Such guidance can be implemented when the diameter of the nanowire is approximately of the order of $\lambda/n$, with $\lambda$ being the wavelength concerned and n the refractive index of the nanowire material. Such a nanowire supports only a guided mode, which plays a predominant role in its optical properties. The aim is then to find a mirror which provides a high reflection coefficient for the guided mode. The best solution known at the present time consists of a hybrid planar mirror, formed by a layer of silver covered with a thin layer of dielectric as described in the document "Efficient photonic mirrors for semiconductor nanowires" by I. Friedler at al. published in OPTICS LETTERS on 15 Nov. 2008 Vol. 33, No. 22, pages 2635 to 2637.

The great drawback with these planar mirrors has in the fact that they have to be integrated via a complex and costly step of mounting on a substrate other than that used to grow the nanowires (step known to those skilled in the art as "flip-chip"). Furthermore, such an approach does not currently make it possible to mount large surface areas (300 mm diameter in the microelectronics standards) reliably and reproducibly.

OBJECT OF THE INVENTION

The aim of the present invention is to propose a solution that makes it possible to form an optoelectronic arrangement that is compact, highly reproducible, and compatible with fabrication in large surface areas.

Efforts are being made to achieve this aim notably by virtue of an optoelectronic arrangement comprising a semiconductor nanowire intended to participate in the processing, notably in a reception and/or an emission, of a light concerned and a mirror reflecting the light concerned, the semiconductor nanowire comprising a first section and a second section, and in which the mirror surrounds at least longitudinally, the first section of the semiconductor nanowire, said second section extending out of the mirror. Furthermore, an aperture of the mirror wholly or partly filled by the first section has lateral aperture dimensions less than $\lambda/5n$, with n being the refractive index of the material of the first section of the semiconductor nanowire, and $\lambda$ being the wavelength of the light concerned. The arrangement comprises a substrate on which the mirror rests.

Advantageously, the semiconductor nanowire extends, via its first section, from said substrate.

Preferably, the mirror comprises a layer that is reflective to the light concerned, notably the reflecting layer comprises a material with a coefficient of reflection in terms of intensity, at the wavelength concerned and for a planar wave at normal incidence, that is greater than or equal to 60%, such as, for example, gold, aluminium, copper or silver.

Moreover, the mirror may comprise a buffer layer that is transparent to the light concerned increasing the reflectivity of the mirror, notably the buffer layer is made of a dielectric material comprising $SiO_2$ or $Si_3N_4$, or of an electrically conductive transparent material such as indium-tin oxide or zinc oxide, the reflecting layer being arranged between the substrate and the buffer layer.

Preferentially, the reflecting layer has a thickness greater than 30 nm, and the buffer layer has a thickness between 2 nm and 20 nm.

According to a particular implementation, the cross sections of the first and second sections are substantially identical.

According to another implementation, the second section, arranged in continuity with the first section, has a cross section whose surface area is greater than the surface area of the cross section of the first section so as to form a shoulder with said first section.

Advantageously, the cross section of the second section at its interface with the mirror has dimensions greater than those of the aperture of the mirror wholly or partly filled by the first section.

The invention also relates to an optoelectronic device which comprises a plurality of arrangements as described, notably sharing one and the same mirror, and each semiconductor nanowire is coupled to means that make it possible, with said semiconductor nanowire, to emit or receive the light concerned.

The invention also relates to a method for fabricating at least one arrangement as described, said method comprising the following steps:
  the provision of a substrate, the production of the mirror on said substrate, the formation of the semiconductor nanowire such that the first section of the semiconductor nanowire is surrounded at least longitudinally by the mirror, and that the second section of the semiconductor nanowire extends out of the mirror.

Moreover, the method may comprise the formation of an aperture in the mirror, the step of formation of the semiconductor nanowire being performed by growth, notably by epitaxy, from the aperture.

Preferably, the aperture is formed in such a way as to have a bottom delimited by the substrate, or by a part of the mirror, the growth of the semiconductor nanowire being performed from said bottom.

Advantageously, the step of formation of the mirror, performed before the step of formation of the semiconductor nanowire, comprises the deposition of a first layer of a material suitable for catalysing the growth of the semiconductor nanowire and the deposition of one or more second layers on the first layer in such a way that the bottom of the aperture is formed by a part of the first layer and that the internal side wall of the aperture is delimited at least partly by the second layer or layers.

According to one implementation, the first section is obtained by axial growth and the second section is obtained by axial and/or radial growth.

According to a particular implementation, the method comprises the following successive steps:

forming, from the substrate, an initial section of the semiconductor nanowire comprising at least the first section, notably from a step of etching of the substrate, forming the mirror around the initial section, forming the rest of the semiconductor nanowire by growth, notably axial and/or radial, from the initial section, preferably from an end of the initial section protruding from an outer surface of the mirror.

BRIEF DESCRIPTION OF THE DRAWINGS

Other advantages and features will become more clearly apparent from the following description of particular embodiments of the invention given as nonlimiting examples and represented in the attached drawings, in which.

DESCRIPTION OF PREFERRED
EMBODIMENTS OF THE INVENTION

The present optoelectronic arrangement differs from the prior art notably in that the mirror surrounds a section of the semiconductor nanowire situated between its two opposite longitudinal ends.

Figure 1:
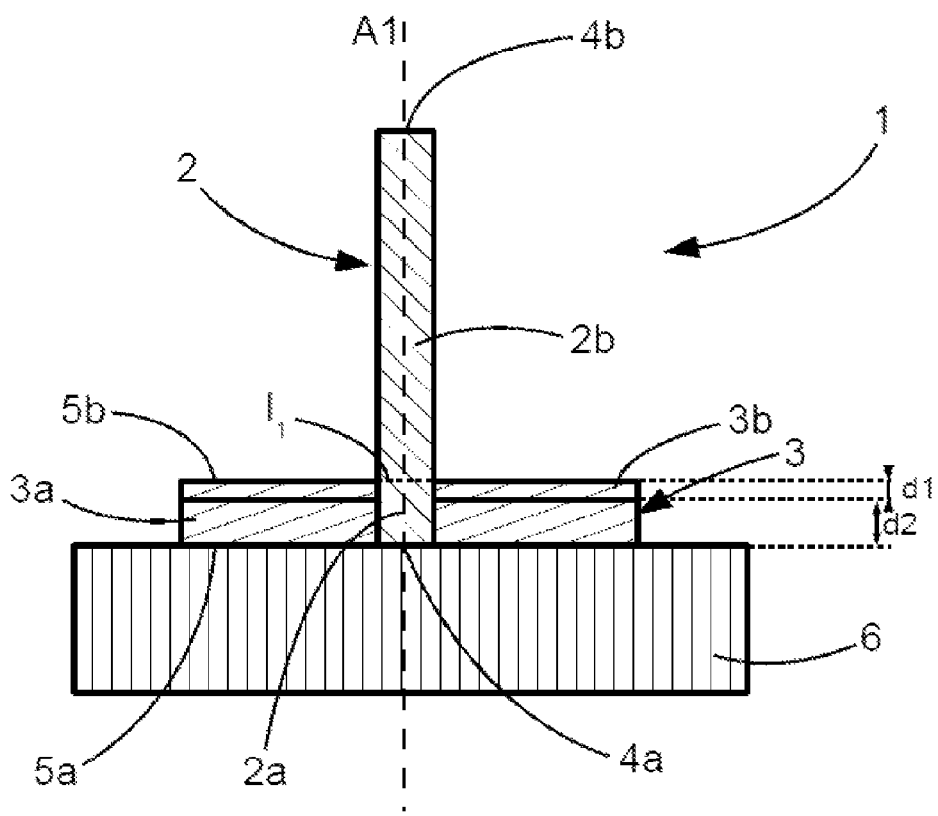
FIG. 1 is a cross-sectional view of an arrangement according to a particular mode of execution.

As illustrated in FIG. 1, the optoelectronic arrangement 1 comprises a semiconductor nanowire 2 intended to participate in the processing of a light concerned.

"Processing of a light concerned" should be understood to mean that the semiconductor nanowire 2 can participate in a reception (for example in the context of a use of the semiconductor nanowire 2 in a photovoltaic cell) and/or an emission (for example in the context of a use of a semiconductor nanowire 2 in a light-emitting diode) of the light concerned. Typically, the semiconductor nanowire 2 will be able to be electrically doped, wholly or partly, by a first type, notably p type, and will at least partly form a p/n junction of a light-emitting diode or of a photodiode.

Advantageously, the semiconductor nanowire 2 is formed from one or more semiconductor materials belonging, for example, to the families (Si, Ge) or III-V (such as GaAs, InAs, GaP InP, GaSb, GaN, AlN, InN) or II-VI (such as CdTe, CdSe, ZnTe, ZnSe, ZnO, MgO) and their alloys.

Moreover, the arrangement comprises a mirror 3 that is reflective to the light concerned. The semiconductor nanowire 2 comprising a first section 2a and a second section 2b, the mirror 3 surrounds, at least longitudinally, the first section 2a of the semiconductor nanowire 2, said second section 2b extending out of the mirror 3.

More particularly, the semiconductor nanowire 2 extends between two opposite longitudinal ends 4a and 4b of the semiconductor nanowire 2, and the second section 2b is in continuity with the first section 2a. In fact, the limit between the first section 2a and the second section 2b is represented by the broken line $I_1$ in FIG. 1.

The fact that "the mirror 3 surrounds at least longitudinally, the first section 2a of the semiconductor nanowire 2" should be understood to mean that the mirror possesses a through aperture within which the first section 2a is arranged.

In FIG. 1, the aperture of the mirror 3 is a through aperture and is wholly or partly filled by the first section 2a in such a way that the mirror 3 forms a sheath around the semiconductor nanowire 2 in the first section 2a. The end 4a of the semiconductor nanowire 2, delimited by a part of the first section 2a is advantageously in contact with a substrate 6 at the level of a first face 5a of the mirror 3. The second section 2b extends from a second face 5b of the mirror 3, called reflecting face of the mirror 3, opposite the first face 5a.

"Aperture wholly or partly filled by the first section 2a" should be understood to mean that the lateral dimensions of the first section 2a can be less than or equal to the lateral dimensions of the aperture. In other words, between the two ends 4a, 4b of the semiconductor nanowire 2, the mirror 3 surrounds the first section 2a with or without contact (in FIG. 1, the mirror 3 is in contact with the first section 2a between the two ends 4a and 4b of the semiconductor nanowire 2).

In FIG. 1, the lateral dimensions, or, if appropriate, the diameter, of the aperture and of the first section 2a, are oriented substantially perpendicularly to the axis A1.

The semiconductor nanowire 2 is advantageously a vertical structure relative to the mirror which is considered as a planar structure.

Preferably, the aperture of the mirror 3 wholly or partly fined by the first section 2a has lateral aperture dimensions less than $\lambda/5n$, with n being the refractive index of the first section 2a of the semiconductor nanowire 2, and $\lambda$ being the wavelength of the light concerned. Advantageously, the aperture has a disc-shaped section, so it is considered that the diameter of the aperture is less than $\lambda/5n$. These dimensions make it possible to prevent the light concerned from leaking through the aperture at the level of the mirror and being lost.

Preferably, the lateral dimensions, or, if appropriate, the diameter of the aperture, are between 5 nm and 30 nm.

Preferably, the arrangement comprises a substrate 6 on which the mirror 3 rests.

Preferentially, the semiconductor nanowire 2 extends, via its first section 2a, from said substrate 6 (FIG. 1). This geometry makes it possible to obtain a compact arrangement while providing a good seat for the semiconductor nanowire 2 at the level of the mirror 3. It will then be understood that the end 4a of the semiconductor nanowire 2 is in contact with the substrate 6, and that the end 4b of the semiconductor nanowire 2 is distal to the substrate 6 because the semiconductor nanowire 2 extends, from its end 4a, in a direction opposite to the substrate 6.

According to a particular preferred, but optional, implementation, the mirror 3 comprises a reflecting layer 3a to the light concerned. Preferably, the reflecting layer 3a comprises (or consists of) a material with a coefficient of reflection in terms of intensity, at the wavelength concerned and for a planar wave at normal incidence, that is greater than or equal to 60%, such as, for example, gold, aluminium, copper or silver. In order to increase the reflectivity, the mirror 3 may also comprise a buffer layer 3b that is transparent to the light concerned. This buffer layer 3b is, preferably, arranged at the interface between the first section 2a and the second section 2b. Preferably, the buffer layer 3b is made of a dielectric material comprising $SiO_2$ or $Si_3N_4$. Alternatively, the buffer layer 3b is made of an electrically conductive transparent material such as zinc oxide or indium-tin oxide (also known by the acronym ITO in the field). The thickness of this buffer layer 3b is preferably such that it eliminates the plasmonic excitation of the reflecting layer 3a when it is reached by the light concerned. Preferably, the thickness $d_1$ of the buffer layer 3b is between 2 nm and 20 nm, and the thickness $d_2$ of the reflecting layer 3a is greater than 30 nm.

The reflecting layer 3a may be formed by a stack of one or more sublayers of identical or different types.

As illustrated in FIG. 1, the reflecting layer 3a is arranged between the substrate 6 and the buffer layer 3b. In fact, it should be placed at the level of the reflecting face receiving the light concerned, to be reflected.

According to a particular embodiment illustrated in FIG. 1, the cross sections of the first and second sections 2a, 2b are substantially identical. In other words, between the two opposite longitudinal ends 4a and 4b of the semiconductor nanowire 2, the cross section of said semiconductor nanowire 2 remains substantially constant.

Figure 2:
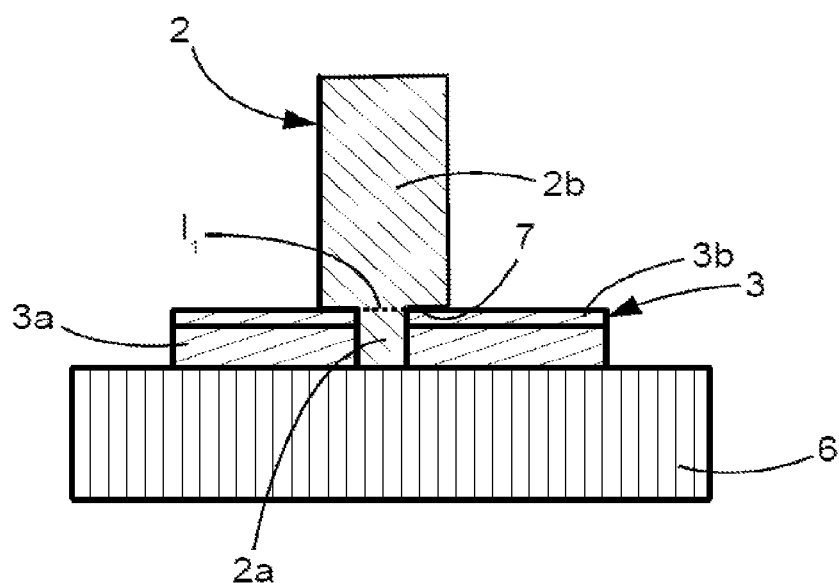
FIG. 2 illustrates a variant of the mode of execution of FIG. 1.

According to another particular embodiment illustrated in FIG. 2, which reprises the same elements as FIG. 1 (preferably, everything stated above can be applied to this FIG. 2), the second section 2b, arranged in continuity with the first section 2a, has a cross section whose surface area is greater than the surface area of the cross section of the first section 2a so as to form a shoulder 7 with said first section 2a. In other words, at the level of the line $I_1$, the junction between the first section 2a and the second section 2b forms a shoulder 7 in such a way that the semiconductor nanowire 2 is wider in its second section 2b than in its first section 2a. The advantage of such a semiconductor nanowire 2 is to make it possible to avoid any leaks of light at its base at the level of the mirror while providing, in its second section 2b, a greater outer surface area to be functionalized within the framework of the formation of a p/n junction, for example. In this way, it is thus possible to produce lateral p/n junctions (for example, for light-emitting diodes or photovoltaic cells). It is also possible to act on the diameter of the semiconductor nanowire 2 to control the optical modes guided by said semiconductor nanowire 2 (crucial for certain applications, notably for forming a single-photon source). Moreover, the cross section of the second section 2b at its interface with the mirror 3 can have dimensions greater than those of the aperture of the mirror 3 wholly or partly filled by the first section 2a.

The section of the section 2b can also vary, for example continually between its value at the level of the mirror and its value (greater or smaller) at its free end. The semiconductor nanowire 2 may also exhibit any other profile.

Figure 3:
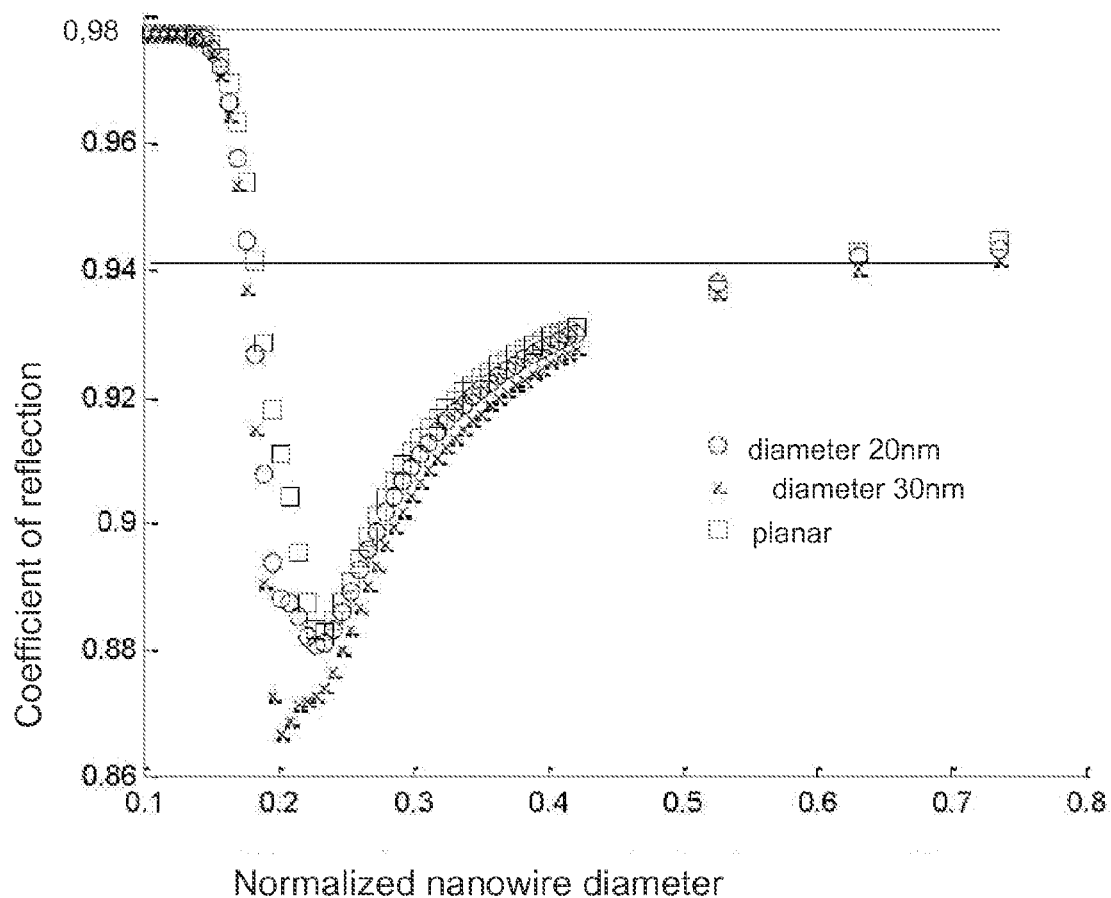
FIG. 3 illustrates the variation of the coefficient of reflection of a mirror as a function of the normalized diameter of a nanowire for different hole diameters in the mirror from which the nanowire extends.

FIG. 3 shows the coefficient of reflection of a guided mode for a single GaAs nanowire on a mirror consisting of a reflecting layer of gold 100 nm thick, covered with a buffer layer of silica 9 nm thick, as a function of the normalized diameter $d/\lambda$ of the section 2b of the nanowire considered as cylindrical. The computation is made for a mirror without aperture ("planar" case), and for the cases in which the aperture has a diameter of 20 nm or 30 nm and is entirely filled by the first section 2a of the semiconductor nanowire 2 (as in FIG. 2). It will be noted that this mirror offers a good reflection of the guided mode whatever the diameter of the semiconductor nanowire, and that the presence of an aperture does not affect it in any major way. It can be shown that this result remains true as long as the size of the aperture is small enough, typically less than $\lambda/(5n)$. Thus, the arrangement allows for a good reflection while being more compact and easy to fabricate.

Figure 4:
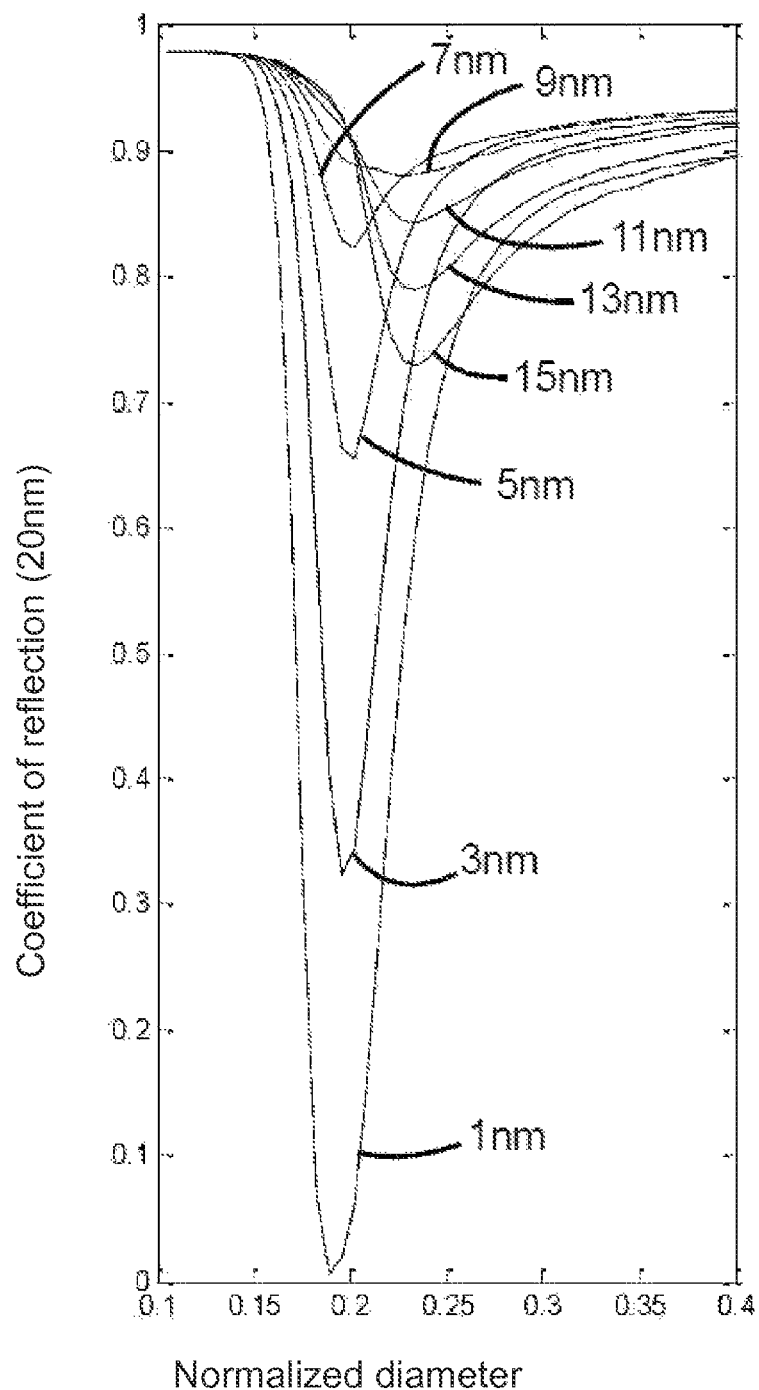
FIG. 4 illustrates the variation of the coefficient of reflection of a mirror as a function of the normalized diameter of a nanowire for different thicknesses of a buffer layer of the mirror.

For its part, FIG. 4 illustrates the importance of the layer 3b of dielectric material. It presents the coefficient of reflection of the guided mode of the nanowire for different thicknesses of the buffer layer, and for an aperture size of 20 nm, as a function of the diameter of the semiconductor nanowire for a layer 3a of gold 100 nm thick. Each curve is associated with a corresponding thickness of the buffer layer (respectively 1 nm, 3 nm, 5 nm, 7 nm, 9 nm, 11 nm, 13 nm and 15 nm). In the absence of a buffer layer, or if the latter is too thin (1 nm), the coefficient of reflection is very low for $d/\lambda$ of approximately 0.25, because of the coupling with the surface plasmon modes of the reflecting layer. A suitable thickness of the buffer layer, here 9 nm, makes it possible, however, to obtain a very high coefficient of reflection (R>0.85) regardless of the diameter of the semiconductor nanowire.

In the examples of FIGS. 3 and 4, $\lambda$ was set at 1 µm.

In a way that is applicable to everything stated above, the substrate 6 and at least the base of the semiconductor nanowire 2 in contact with the substrate 6 advantageously have the same type of electrical doping. This makes it possible to functionalize the arrangement by using the substrate 6 as electrical contact element, notably on a rear face of the substrate 6 opposite the face of the substrate on which the mirror 3 is arranged.

The substrate 6 can be made of monocrystalline silicon, of a III-V material such as GaAs, of sapphire, or of a cheaper material such as polycrystalline Si or a metallic alloy.

Figure 5:
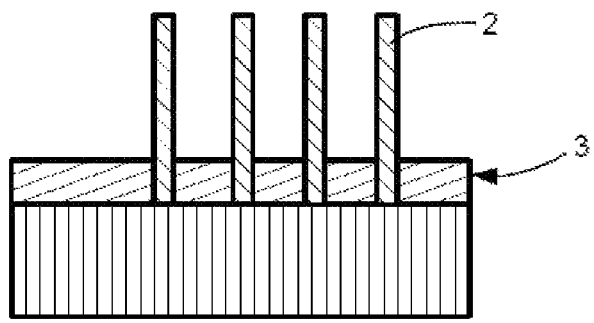
FIGS. 5 to 10 illustrate, by cross-sectional views, different steps of a method for fabricating an arrangement.

The invention also relates to an optoelectronic device which comprises a plurality of arrangements as described. In the field, such a device is also referred to as a semiconductor nanowire mat 2. Preferably, the arrangements share one and the same mirror 3 (FIG. 5). Moreover, each semiconductor nanowire 2 is coupled to means (not represented) that make it possible, with said semiconductor nanowire 2, to emit or receive the light concerned. Notably, these means can form, with each of the semiconductor nanowires 2, a p/n junction.

It will then be understood that the optoelectronic device can be a photovoltaic cell, a light-emitting diode display, or any other type of optoelectronic device suitable for participating in the emission or the reception of a light concerned.

In the case of the emission of the light concerned, the latter is generated from each semiconductor nanowire and the mirror makes it possible to increase the emission effectiveness by limiting the radiation losses by escape to the substrate and/or makes it possible to make the emission more directional.

In the case of the reception/detection of the light concerned, all the light that has not initially been taken into account by the semiconductor nanowires touches the mirror so as to be then reflected at least towards the semiconductor nanowires. The result of this is that the quantity of radiation absorbed is magnified.

In the context of the optoelectronic device that has a dense network of GaAs nanowires on a GaAs substrate (useful in particular in the context of light-emitting diode or photovoltaic cell applications), in the absence of the mirror, the reflection obtained by the surface area of the substrate is less than $(n-1)^2/(n+1)^2=0.3$, in which n designates the refractive index of the substrate at the wavelength concerned (here 1 µm), whereas the presence of the mirror makes it possible to obtain a reflectivity greater than 90% for a wide range of nanowire diameters (nanowire diameter less than 150 nm in the case of the example). "Dense network" should be understood here to mean more than one nanowire per $µm^2$.

The invention also relates to a method for fabricating an optoelectronic arrangement or an optoelectronic device as described. In particular, this method comprises a step of production of a mirror 3 (FIG. 6), and a step of formation of the semiconductor nanowire 2 in such a way that a first section 2a of the semiconductor nanowire 2 is surrounded at least longitudinally by the mirror 3, and that a second section 2b of the semiconductor nanowire 2 extends out of the mirror 3 (FIGS. 1 and 2).

The step of formation of the semiconductor nanowire 2 and/or the step of production of the mirror 3 can be configured in such a way as to form the different embodiments of the arrangement, or of the device, described above.

Figure 6:
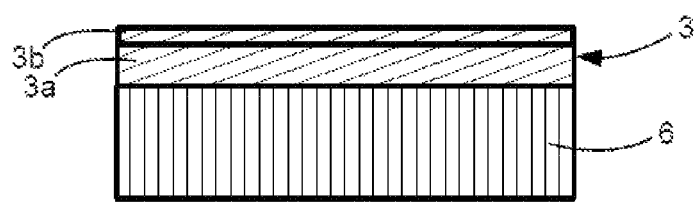

Preferably, the method comprises a step of provision of a substrate 6 and the mirror 3 is produced on said substrate 6 (FIG. 6).

Figure 7:
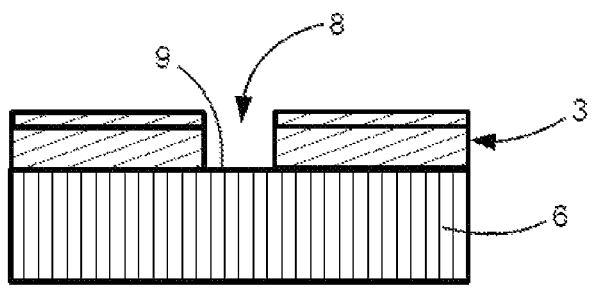
Figure 8:
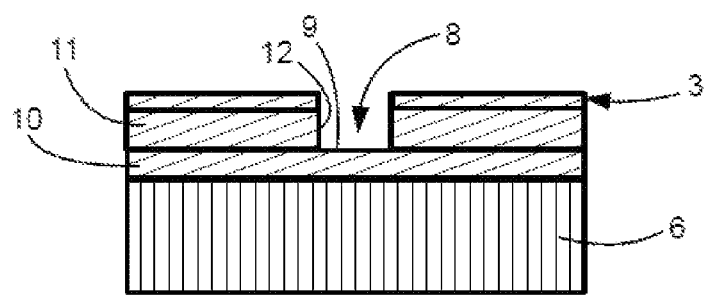

According to one embodiment, the method comprises the formation of an aperture 8 in the mirror 3 (FIGS. 7 and 8), the step of formation of the semiconductor nanowire 2 being performed by growth, notably by epitaxy, from the aperture 8.

Preferably, the aperture 8 is formed in such a way as to have a bottom 9 delimited by the substrate 6 (FIG. 7), or by a part of the mirror (FIG. 8), the growth of the semiconductor nanowire 2 being performed at least from said bottom 9. Following the growth, the semiconductor nanowire 2 obtained is in contact with the substrate 6 (if appropriate, the part of the mirror is located at the top 4b of the semiconductor nanowire 2, opposite the substrate 6).

According to a particular execution (FIG. 8), the step of formation of the mirror 3 is performed before the step of formation of the semiconductor nanowire 2 and comprises the deposition of a first layer 10 of a material suitable for catalysing the growth of the semiconductor nanowire 2 and the deposition of one or more second layers 11 on the first layer in such a way that the bottom 9 of the aperture 8 is formed by a part of the first layer 10 and that the internal side wall 12 of the aperture 8 is delimited at least partly by the second layer or layers 11. The first layer 10 may, for example, be of gold in order to catalyse the growth of a nanowire made of silicon or of a II-VI semiconductor material such as CdTe or ZnTe.

Moreover, the step of formation of the mirror 3 may advantageously comprise a step of formation of the reflecting layer 3a (as described above) on the substrate 6 and a step of formation of the buffer layer 3b as described above) on the reflecting layer 3a (FIG. 6).

It is understood that the mirror 3 and the aperture 8 can be formed:
  by deposition of the mirror and then by etching of the mirror 3 in order to form the aperture 8 (after deposition of the mirror, a layer of resin is deposited, a lithography step then makes it possible to define one or more apertures in the resin, which is then transferred by etching into the stack forming the mirror),
  by formation of a hard mask, then deposition of the mirror before removing the hard mask (in this case the substrate is covered with a layer of resin, exposed to light and then revealed so as to leave bumps of resin in the future position of the aperture or apertures. The desired stack forming the mirror is then deposited and the fabrication is then terminated with a well known "lift-off" step),
  by the use of nanoprinting,
  by spontaneous structuring of a block copolymer film.

The synthesis of the nanowire, notably semiconductor and advantageously electrically doped, can then be performed from the aperture 8 using different epitaxial growth methods such as organometal vapour phase epitaxy (OMVPE), molecular jet epitaxy (MJE) or, for some materials like ZnO, by low-temperature hydrothermal synthesis.

Depending on the materials and the techniques used, the growth will or will not by catalyst-assisted. Any known method for the growth of semiconductor nanowires is potentially compatible with the use of the mirror 3 as described.

As an example, gold is traditionally used for the growth by OMVPE of Si nanowires. This catalyst will be provided in this case by the first layer 10, and the etching of the mirror 3 will be conducted in such a way as to retain, in this case, the first layer 10. During the growth, the gold present initially at the bottom of the aperture 8 forms a small drop which remains at the top of the nanowire. The rest of the mirror 3 is chosen in such a way as to remain inert during the growth, while having good optical properties (for example, aluminium is a good choice).

Alternatively, a nanowire of GaN can be obtained with no additional catalyst element, by MJE and by OMVPE. In this case, the mirror will be made of materials that are inert with respect to the growth of the nanowire, and a selective epitaxy of the nanowire will be obtained in the aperture of the mirror.

Once the growth of the semiconductor nanowire is sufficient for it to emerge from the hole, a radial and/or axial heterostructure of this semiconductor nanowire can be produced.

In a general manner applicable to the different implementations of the method, the first section 2a of the semiconductor nanowire 2 is obtained by axial growth and the second section 2b of the semiconductor nanowire 2 is obtained by axial and/or radial growth.

"Axial growth" should be understood to mean that the semiconductor nanowire increases its length without increasing its diameter (or its lateral dimensions), or increases its length much faster (more than ten times faster) than its diameter (or its lateral dimensions). This axial growth makes it possible to modulate the nature, composition or doping of the semiconductor obtained by axial growth of the semiconductor nanowire and to define, along the axis of the semiconductor nanowire passing through its two opposite longitudinal ends, quantum barriers or boxes.

"Radial growth" should be understood to mean that the semiconductor nanowire increases in diameter (or in lateral dimensions) between one and ten times faster than in length, that is to say that it increases little or not at all in length. This radial growth makes it possible to define lateral quantum wells or even radial p/n junctions.

During the step of growth of the semiconductor nanowire 2, it is possible to switch over from one growth (radial/axial) to the other by adjusting the growth conditions, in order to fabricate more complex structures. As an example, photonic wire-based single-photon sources have been fabricated by defining a quantum box by axial growth, then by using a step of radial growth to incorporate it in a cylindrical waveguide of controlled size. A person skilled in the art will therefore be able to implement an appropriate growth of the semiconductor nanowire according to the desired optoelectronic device.

In the preceding examples, use is made of metals that are suited by their optical properties to the fabrication of the mirror, and inert during the growth of the semiconductor nanowire. If such materials do not exist because of a fixed choice of one of them, or if the aim is simply to minimize the contamination of the semiconductor nanowires by the materials forming the mirror during their growths, an alternative strategy will preferentially be used.

Figure 9:
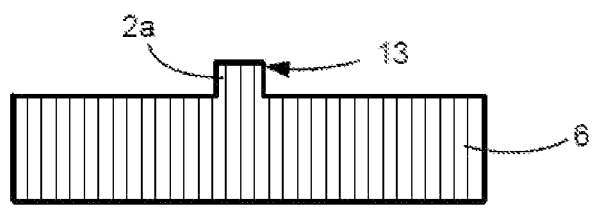
Figure 10:
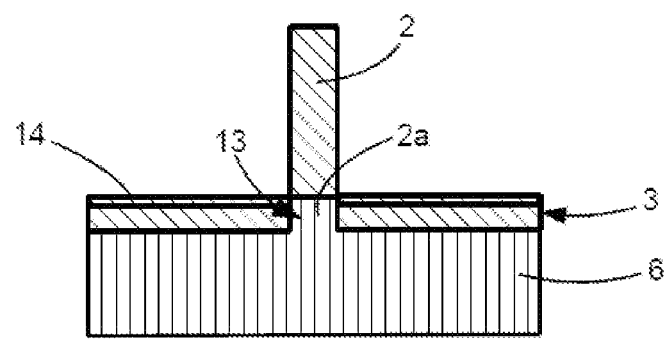

In this alternative strategy, the method comprises the following successive steps:
    forming, from the substrate 6, an initial section 13 of the semiconductor nanowire 2 comprising at least the first section 2a, notably from a step of etching of the substrate 6 (FIG. 9),
    forming the mirror 3 around the initial section 13 (FIG. 10),
    forming the rest of the semiconductor nanowire 2 by growth (FIG. 10), notably axial and/or radial, from the initial section 13, preferably from an end of the initial section protruding from an outer surface 14 of the mirror 3.

The outer surface 14 of the mirror 13 is intended to be arranged facing the light concerned. In other words, the outer surface 14 is opposite the substrate 6. It will then be understood that, in the arrangement, the first section 2a can be formed wholly or partly by a part of the substrate 6.

It is understood that all the materials targeted above in the context of the optoelectronic arrangement can be used in the context of the method in order to form an element of the arrangement with which they are associated.

The method described above can also make it possible to fabricate a plurality of arrangements sharing one and the same mirror (thus forming the optoelectronic device). In this case, the apertures within this mirror or the initials sections produced before forming the mirror, make it possible to form all or part of the semiconductor nanowires by using the apertures as growth mask for the nanowires or the initials sections as starting point for the growth of the rest of the semiconductor nanowires. Thus, the result is a high degree of reproducibility inasmuch as the semiconductor nanowires do not grow randomly but at perfectly defined prioritized sites.

One of the many advantages of the method as described is that it allows for a growth of the semiconductor nanowire at the level of the mirror, thus avoiding the mounting of the nanowire structure on another substrate as in the prior art. The result thereof is that this method can be implemented with significantly lower fabrication costs while favouring reproducibility.

The invention claimed is:
1. An optoelectronic arrangement comprising:
    a semiconductor nanowire to participate in the processing of a light, the semiconductor nanowire comprising a first section and a second section: and
    a mirror to reflect the light, said mirror surrounding at least longitudinally, the first section of the semiconductor nanowire, said second section extending out of the mirror, wherein:
        an aperture of the mirror wholly or partly filled by the first section has lateral aperture dimensions less than $\lambda/5n$, with n being the refractive index of the material of the first section of the semiconductor nanowire, and $\lambda$ being the wavelength of the light,
        the mirror rests on a substrate and comprises a layer that is reflective to the light and a buffer layer that is transparent to the light increasing the reflectivity of the mirror, the reflecting layer being arranged between the substrate and the buffer layer.

2. The optoelectronic arrangement according to claim 1, wherein the reflecting layer comprises a material with a coefficient of reflection in terms of intensity, at the wavelength concerned and for a planar wave at normal incidence, that is greater than or equal to 60%, such as, for example, gold, aluminium, copper or silver.

3. The optoelectronic arrangement according to claim 1, wherein the semiconductor nanowire extends, via the first section, from said substrate.

4. The optoelectronic arrangement according to claim 1, wherein the buffer layer is made of a dielectric material comprising $SiO_2$ or $Si_3N_4$, or of an electrically conductive transparent material.

5. The optoelectronic arrangement according to claim 1, wherein the reflecting layer has a thickness greater than 30 nm, and in that the buffer layer has a thickness between 2 nm and 20 nm.

6. The optoelectronic arrangement according to claim 1, wherein the cross sections of the first and second sections are substantially identical.

7. The optoelectronic arrangement according to claim 1, wherein the second section, arranged in continuity with the first section, has a cross section whose surface area is greater than the surface area of the cross section of the first section so as to form a shoulder with said first section.

8. The optoelectronic arrangement according to claim 7, wherein the cross section of the second section at its interface with the mirror has dimensions greater than those of the aperture of the mirror wholly or partly filled by the first section.

9. An optoelectronic device, which comprises a plurality of optoelectronic arrangements according to claim 1, wherein each semiconductor nanowire is coupled to means to enable, with said semiconductor nanowire, to emit or receive the light.

10. A method for fabricating at least one optoelectronic arrangement comprising:
    providing a substrate,
    forming a mirror on said substrate,
    forming a semiconductor nanowire such that a first section of the semiconductor nanowire is surrounded at least longitudinally by the mirror, and that a second section of the semiconductor nanowire extends out of the mirror,
    wherein forming the mirror includes an aperture of the mirror wholly or partly filled by the first section has lateral aperture dimensions less than $\lambda/5n$, with n being the refractive index of the material of the first section of the semiconductor nanowire, and $\lambda$ being the wavelength of the light.

11. The method according to claim 10, comprising:

forming an aperture in the mirror, and wherein the step of formation of the semiconductor nanowire is performed by growth of the semiconductor nanowire from the aperture.

12. The method according to claim 11, wherein the aperture is formed to have a bottom delimited by the substrate, or by a part of the mirror, the growth of the semiconductor nanowire being performed from said bottom.

13. The method according to claim 12, wherein the step of forming the mirror is performed before the step of formation of the semiconductor nanowire, and comprises
   deposition of a first layer of a material suitable for catalysing the growth of the semiconductor nanowire and
   deposition of one or more additional layers on the first layer such that the bottom of the aperture is formed by a part of the first layer and that an internal side wall of the aperture is delimited at least partly by the one or more additional layers.

14. The method according to claim 10, wherein the first section is obtained by axial growth and the second section is obtained by axial and/or radial growth.

15. The method according to claim 10, comprising the successive steps:
   forming, from the substrate, an initial section of the semiconductor nanowire comprising at least the first section,
   forming the mirror around the initial section,
   forming the rest of the semiconductor nanowire by growth from the initial section.

16. The method of claim 15, wherein forming the rest of the semiconductor nanowire is from an end of the initial section protruding from an outer surface of the mirror.

17. The method of claim 15, wherein forming the initial section of the semiconductor nanowire is by etching of the substrate.

18. The optoelectronic arrangement according to claim 1, wherein the buffer layer is indium-tin oxide or zinc oxide.

19. The method according to claim 11, wherein formation of the semiconductor nanowire is performed by epitaxial growth.

20. The optoelectronic device of claim 9, wherein the plurality of optoelectronic arrangements share one and the same mirror.

* * * * *